(12) United States Patent
Hasegawa

(10) Patent No.: US 9,873,218 B2
(45) Date of Patent: Jan. 23, 2018

(54) METHOD OF MANUFACTURING RESIN SEALING MODULE, AND RESIN SEALING MODULE

(71) Applicant: SHINDENGEN ELECTRIC MANUFACTURING CO., LTD., Chiyoda-ku, Tokyo (JP)

(72) Inventor: Masaaki Hasegawa, Hanno (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 146 days.

(21) Appl. No.: 14/435,912

(22) PCT Filed: Oct. 16, 2014

(86) PCT No.: PCT/JP2014/077528
§ 371 (c)(1),
(2) Date: Apr. 15, 2015

(87) PCT Pub. No.: WO2016/059699
PCT Pub. Date: Apr. 21, 2016

(65) Prior Publication Data
US 2016/0214290 A1    Jul. 28, 2016

(51) Int. Cl.
*B29C 45/14*    (2006.01)
*B29C 45/17*    (2006.01)
(Continued)

(52) U.S. Cl.
CPC .. *B29C 45/14639* (2013.01); *B29C 45/14819* (2013.01); *B29C 45/174* (2013.01);
(Continued)

(58) Field of Classification Search
CPC .............. H01L 21/54; B29C 45/14639; B29C 45/14655; B29C 45/14819; B29C 45/34; B29C 45/174; B29C 2043/182
See application file for complete search history.

(56) References Cited

U.S. PATENT DOCUMENTS 6,287,504 B1 *  9/2001  Kanematsu ......... B29C 45/1703
                                                                264/1.9
2001/0042913 A1 * 11/2001 Fukuda ................. H01L 21/565
                                                                257/697
(Continued)

FOREIGN PATENT DOCUMENTS

| JP | 2012-186371 | 9/2012 |
| JP | 2013-115265 | 6/2013 |
| JP | 2013-207172 | 10/2013 |

OTHER PUBLICATIONS

International Search Report for PCT/JP2014/077528 dated Dec. 22, 2014, 2 pages.
(Continued)

*Primary Examiner* — Matthew Daniels
(74) *Attorney, Agent, or Firm* — Nixon & Vanderhye P.C.

(57) ABSTRACT

A method of manufacturing a resin sealing module, which includes an injection step of injecting an uncured curable liquid resin into a module case and a positioning step of positioning the mold member, is provided. In the injection step, a substrate with electronic components is immersed into the curable liquid resin. In the positioning step, the mold member is positioned so that inside space of the first partition wall faces a second region. In the positioning step, at least a protruding end portion of the first partition wall is immersed into the curable liquid resin while a gas layer is held in the inside space. Thereby, a partial region of an upper
(Continued)

surface of the curable liquid resin is depressed by the gas layer, so that this region is positioned lower in level than other regions.

4 Claims, 7 Drawing Sheets

(51) Int. Cl.
| | |
|---|---|
| B29C 45/34 | (2006.01) |
| H05K 7/02 | (2006.01) |
| H01L 23/24 | (2006.01) |
| H01L 21/50 | (2006.01) |
| H05K 5/06 | (2006.01) |
| B29K 101/10 | (2006.01) |
| B29L 31/34 | (2006.01) |

(52) U.S. Cl.
CPC .............. *B29C 45/34* (2013.01); *H01L 21/50* (2013.01); *H01L 23/24* (2013.01); *H05K 5/064* (2013.01); *H05K 7/02* (2013.01); *B29K 2101/10* (2013.01); *B29L 2031/3406* (2013.01); *B29L 2031/3481* (2013.01); *H01L 2924/0002* (2013.01)

(56) References Cited

U.S. PATENT DOCUMENTS

| | | | |
|---|---|---|---|
| 2002/0071887 A1* | 6/2002 | Seno | B29C 45/174 |
| | | | 425/547 |
| 2003/0129272 A1* | 7/2003 | Shen | B29C 45/0046 |
| | | | 425/123 |
| 2006/0171127 A1* | 8/2006 | Kadoya | B29C 45/14377 |
| | | | 361/752 |
| 2010/0164146 A1* | 7/2010 | Furutono | B29C 37/0003 |
| | | | 264/446 |

OTHER PUBLICATIONS

Written Opinion of the International Searching Authority for PCT/JP2014/077528, dated Dec. 22, 2014, 3 pages.

\* cited by examiner

METHOD OF MANUFACTURING RESIN SEALING MODULE, AND RESIN SEALING MODULE

This application is the U.S. national phase of International Application No. PCT/JP2014/077528, filed 16 Oct. 2014, the entire contents of which is hereby incorporated by reference.

TECHNICAL FIELD

The present invention relates to a method of manufacturing a resin sealing module, and a resin sealing module.

BACKGROUND ART

A resin sealing module, in which a substrate mounted with electronic components on a mounting surface thereof (substrate with electronic components) is resin-sealed, is manufactured, for example, in the following manner.

A substrate with electronic components and a curable liquid resin are housed in a module case. Then, a mold member is pressed onto a surface of the resin while the substrate with electronic components is immersed in the resin. Thus, the surface of the resin is shaped (see, for example, Patent Document 1).

CITATION LIST

Patent Document

[Patent Document 1] Japanese Patent Application, Laid-Open Publication No. 2013-115265

DISCLOSURE OF THE INVENTION

Problems to be Solved by the Invention

When a curable liquid resin is shaped by a mold member, it is necessary to prevent recessed defects from being formed on a surface of the resin, which is caused by the resin being cured while bubbles in the resin reach a surface of the mold member.

The present invention has been made in view of the above circumstances, and has an object to provide a method of manufacturing a resin sealing module and a resin sealing module, which can reliably prevent recessed defects from being formed on the surface of the resin.

Means for Solving the Problems

To solve the problem, the present invention provides a method of manufacturing a resin sealing module in which a substrate with electronic components including a substrate and electronic components mounted on a mounting surface of the substrate is sealed by a resin. The method of manufacturing the resin sealing module includes: a mounting step of mounting electronic components on a first region that is a part of the mounting surface to obtain the substrate with electronic components; a housing step of housing the substrate with electronic components in a module case; an injection step of injecting an uncured curable liquid resin into the module case and immersing the substrate with electronic components into the curable liquid resin; a positioning step of positioning a mold member including a main plate portion and a first partition wall protruding from a first main surface of the main plate portion and surrounding a first predetermined region of the first main surface, so that inside space of the first partition wall faces a second region of the mounting surface, the second region being different from the first region; a curing step of curing the curable liquid resin in the module case; and a removal step of removing the mold member from the cured resin. In the positioning step, at least a protruding end portion of the first partition wall is immersed into the curable liquid resin while a gas layer is held in the inside space, and thereby a partial region of an upper surface of the curable liquid resin is depressed by the gas layer, so that the partial region is positioned lower in level than other regions.

Effects of the Invention

The mold member to be used for the method of manufacturing the resin sealing module of the present invention includes the first partition wall surrounding the first predetermined region of the main plate portion.

For this reason, the gas layer is held in the space inside the first partition wall, and the partial region of the curable liquid resin is depressed by the gas layer, thus enabling shaping of the surface of the resin.

The resin in the region depressed by the gas layer does not contact the mold member, thereby making it possible to enlarge a region of the surface of the resin, which does not contact the mold member, compared to the conventional case. Additionally, bubbles do not remain in the region not contacting the mold member, thus making it possible to suppress recessed defects from being formed on the surface of the resin.

MODE FOR CARRYING OUT THE INVENTION

[First Embodiment] (Resin Sealing Module)

Hereinafter, a method of manufacturing a resin sealing module according to a first embodiment of the present invention will be described.

Figure 1:
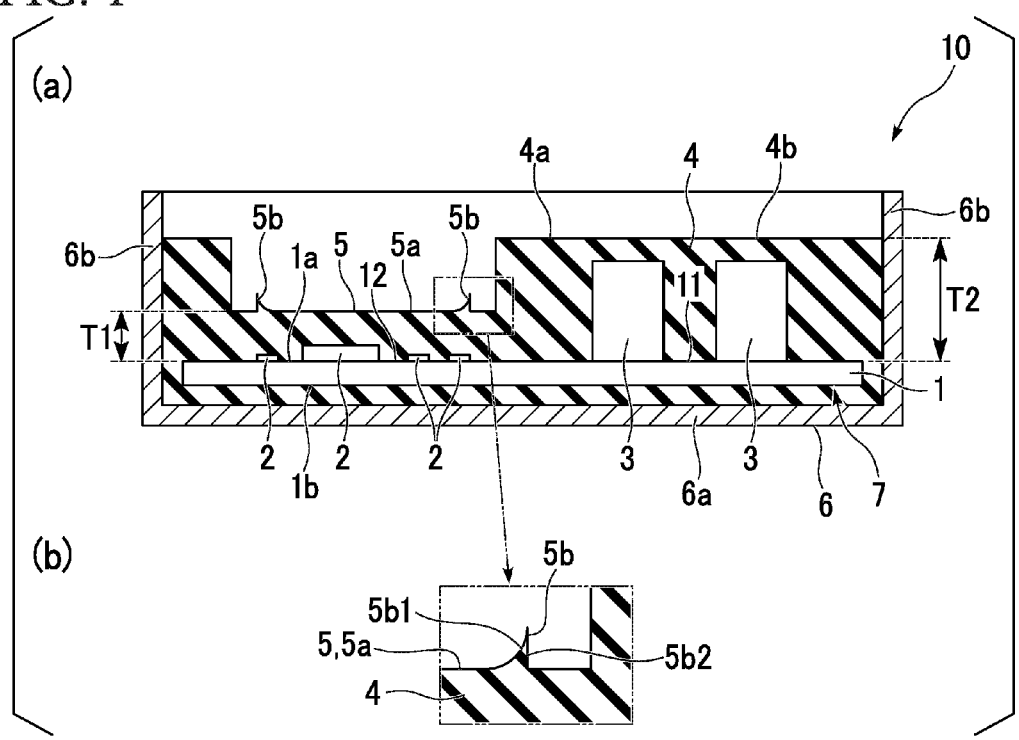
FIG. 1 is a cross-sectional view showing a resin sealing module according to a first embodiment of the present invention, (a) is an overall view, and (b) is an enlarged view.
Figure 2:
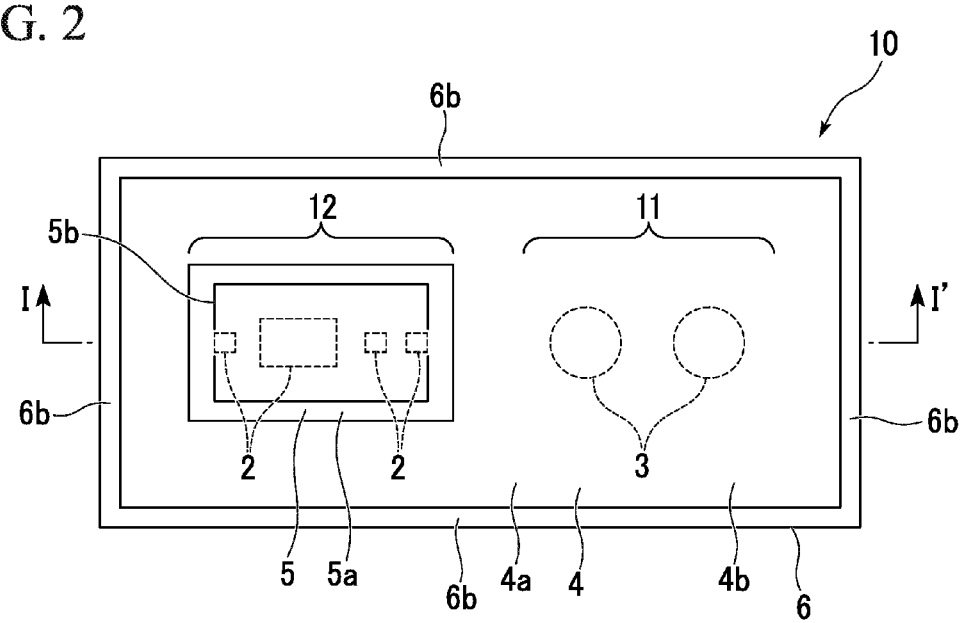
FIG. 2 is a plan view showing the resin sealing module shown in FIG. 1.

FIG. 1 is a cross-sectional view showing a resin sealing module 10 according to the first embodiment of the present invention. FIG. 2 is a plan view showing the resin sealing module 10. FIG. 1 is a cross-sectional view taken along a line I-I' shown in FIG. 2.

As shown in FIGS. 1 and 2, the resin sealing module 10 includes a substrate with electronic components 7, a module case 6 housing the substrate with electronic components 7, and a sealing resin 4 filling the module case 6 and embedded with the substrate with electronic components 7.

The substrate with electronic components 7 includes a printed substrate 1, and electronic components 2 and 3 mounted on a mounting surface 1a of the printed substrate 1.

The electronic components 3 are electronic components with relatively great height, such as transformers and electrolytic capacitors. The electronic components 3 are mounted on a first region 11 of the mounting surface 1a of the printed substrate 1.

On the other hand, the electronic components 2 are electronic components with relatively little height, such as IC chips and chip components. The electronic components 2 are mounted on a second region 12, different from the first region 11, of the mounting surface 1a of the printed substrate 1.

The electronic components 2 are smaller in height dimension from the mounting surface 1a of the printed substrate 1 than the electronic components 3.

The substrate with electronic components 7 is housed in the module case 6 so that a rear surface 1b of the printed substrate 1 faces an inner bottom surface of the module case 6 (inner surface of a bottom plate 6a).

It is preferable that the printed substrate 1 is placed on a pedestal (not shown) with predetermined height, which is provided on the bottom plate 6a of the module case 6, and thereby the printed substrate 1 is separated from the bottom plate 6a.

Here, the printed substrate 1 may be housed in the module case 6 so as to contact the bottom plate 6a of the module case 6. Additionally, electronic components, such as chip resistors, may be mounted on the rear surface 1b of the printed substrate 1.

The module case 6 has the bottom plate 6a and a side plate 6b extending upward from a periphery of the bottom plate 6a. The bottom plate 6a may have a rectangular shape in plan view (see FIG. 2). Here, the shape of the module case 6 is not limited to the illustrated example.

The sealing resin 4 is made of, for example, epoxy resin.

A recessed portion 5 is formed on a part of a surface 4a of the sealing resin 4. The recessed portion 5 is formed in a region encompassing the electronic components 2 in plan view.

A low-level region 5a, which is a bottom surface of the recessed portion 5, is lower in level than a region outside the recessed portion 5 (reference region 4b). The recessed portion 5 shown in FIG. 1 and the like has a rectangular shape in plan view (see FIG. 2). Here, the shape of the recessed portion 5 is not limited to the illustrated example.

A thickness T1 of the sealing resin 4 in the low-level region 5a is smaller than a thickness T2 of the sealing resin 4 in the reference region 4b. Since the thickness T1 is larger than the height of the electronic component 2, the sealing resin 4 is embedded with the electronic components 2.

On the substrate with electronic components 7, the electronic components 2 with little height and the electronic components 3 with great height are mounted on different regions 11 and 12 of the mounting surface 1a. On the surface 4a of the sealing resin 4, the recessed portion 5 is formed in a region overlapping the second region 12 on which the electronic components 2 are mounted.

The thickness T1 of the sealing resin 4 under the recessed portion 5 is larger than the height of the electronic component 2 and is smaller than the thickness T2 of the sealing resin 4 in the reference region 4b. For this reason, it is possible to reduce the amount of resin without impairing the function of the sealing resin 4 and to reduce the weight of the resin sealing module 10.

As shown in FIG. 1(b), a molded protruding portion 5b, which protrudes upward, is formed on a bottom surface of the recessed portion 5 (low-level region 5a) in some cases.

The molded protruding portion 5b is formed in a later-described positioning step (see FIG. 3(d)), at a position distanced from the inner side surface of the recessed portion 5 by a thickness of a first partition wall 22.

In the positioning step, the molded protruding portion 5b is formed by surface tension of a thermosetting resin 4A, on a lower end portion of the inner surface of the first partition wall 22 of a mold member 20. For this reason, an inner surface 5b1 of the molded protruding portion 5b is curved such that an inclination angle (inclination angle to the low-level region 5a) increases as a height of the protrusion becomes increased.

An outer surface 5b2 of the molded protruding portion 5b is formed along the inner surface of the first partition wall 22, and thus is formed vertical to the mounting surface 1a.

The molded protruding portion 5b is formed along the later-described first partition wall 22, and thus has an annular shape in plan view (see FIG. 2).

[First Embodiment] (Method of Manufacturing Resin Sealing Module)

Figure 3:
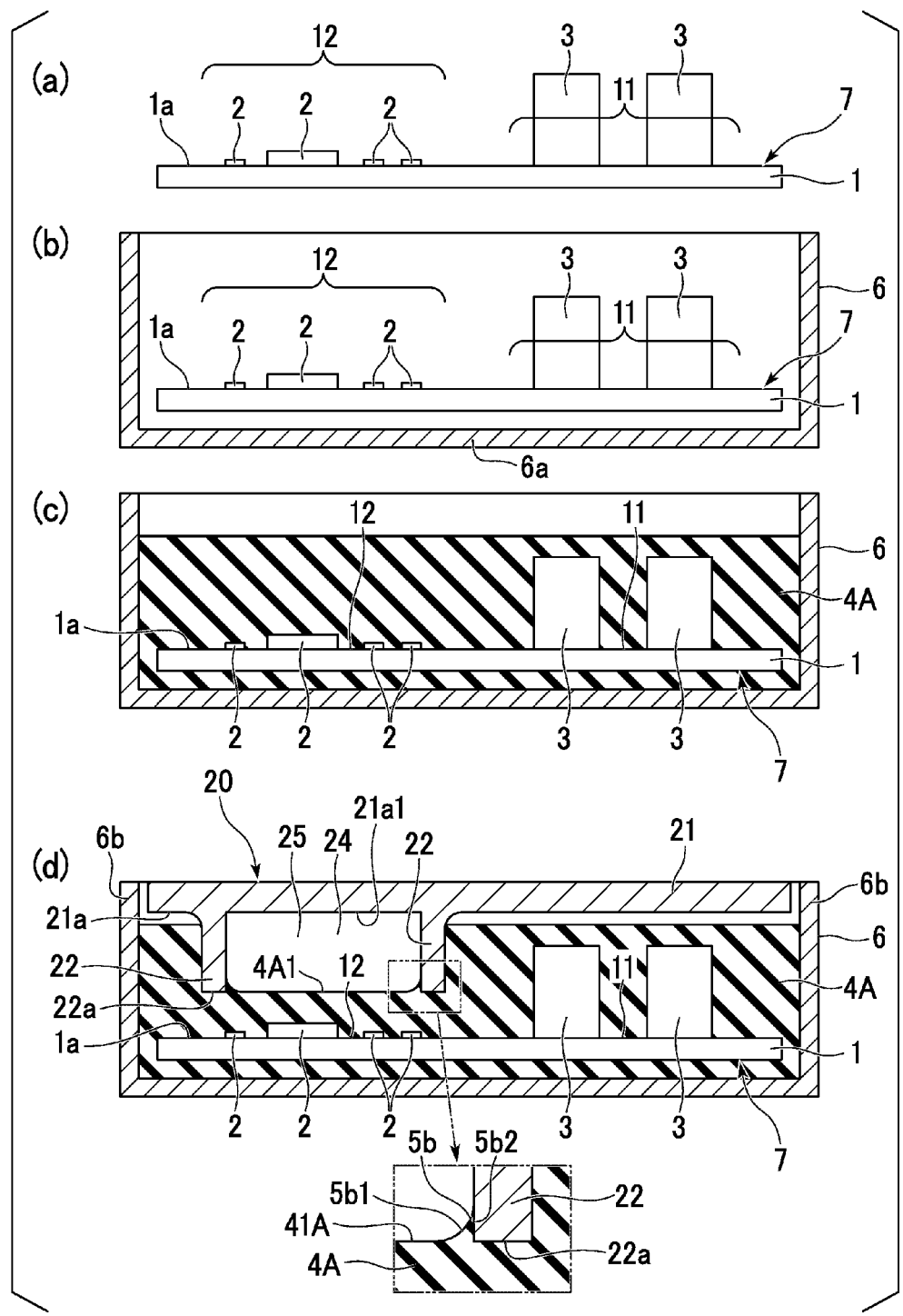
FIG. 3 is a view illustrating a method of manufacturing the resin sealing module according to the first embodiment of the present invention.

Next, a method of manufacturing the resin sealing module according to the first embodiment of the present invention will be described with reference to FIGS. 3 and 4, while taking as an example a case of manufacturing the resin sealing module 10.

(Mounting Step)

As shown in FIG. 3(a), the electronic components 3 are mounted on the first region 11 of the mounting surface 1a of the printed substrate 1, and the electronic components 2 are mounted on the second region 12, thus obtaining the substrate with electronic components 7.

(Housing Step)

As shown in FIG. 3(b), the substrate with electronic components 7 is housed in the module case 6 so that the rear surface 1b of the printed substrate 1 faces the inner bottom surface of the module case 6 (the inner surface of the bottom plate 6a).

(Injection Step)

As shown in FIG. 3(c), an uncured liquid thermosetting resin 4A (e.g., thermosetting epoxy resin) is injected into the module case 6, and the substrate with the electronic components 7 is immersed into the thermosetting resin 4A.

(Positioning Step)

Figure 4:
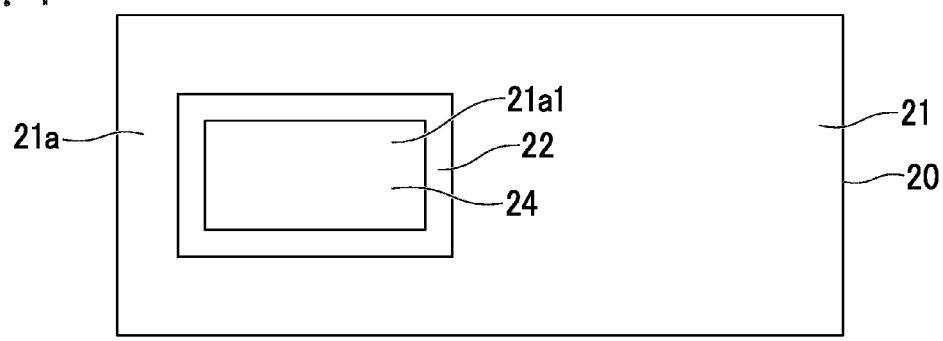
FIG. 4 is a plan view, viewed from the lower side, showing a mold member to be used for the method of manufacturing the resin sealing module according to the first embodiment of the present invention.

Then, as shown in FIGS. 3(d) and 4, the mold member 20 is prepared.

The mold member 20 includes a main plate portion 21, and a first partition wall 22 protruding from a first main surface 21a of the main plate portion 21.

The planar shape of the main plate portion 21 may be a rectangular shape along the planar shape of the module case 6.

It is desirable that the main plate portion 21 has a size such that there becomes a gap between the main plate portion 21 and a side plate 6b of the module case 6 when the main plate portion 21 is placed in the module case 6, as shown in FIG. 3(d).

As shown in FIG. 4, the first partition wall 22 is formed so as to surround a first predetermined region 21a1 that is a partial region of the first main surface 21a. The planar shape and size of the first partition wall 22 is determined such that the aforementioned recessed portion 5 is formed in a region encompassing the electronic components 2 in plan view.

The first partition wall 22 is formed in a cylindrical shape without a hole or notch, so as to hold gas in an inside space 24 when the first partition wall 22 is immersed in the thermosetting resin 4A.

The first partition wall 22 is preferably formed perpendicular to the first main surface 21a. The height of the protrusion of the first partition wall 22 from the first main face 21a is determined so that the sealing resin 4 under the recessed portion 5 can have a suitable thickness (thickness T1 shown in FIG. 1). The height of the protrusion of the first partition wall 22 is set to be constant over the entire circumference.

The mold member 20 is made of, for example, a resin material, such as polypropylene. For example, in a case where the mold member 20 is formed of polypropylene, and epoxy resin is used as the thermosetting resin 4A, it is possible to improve releasability of the mold member 20 and the sealing resin 4.

Then, as shown in FIG. 3(d), the mold member 20 is positioned so that at least the protruding end portion 22a of the first partition wall 22 is immersed in the thermosetting resin 4A. The position of the mold member 20 is determined so that the inside space 24 of the first partition wall 22 faces the second region 12 of the mounting surface 1a.

Since the first partition wall 22 is formed in a cylindrical shape, the first partition wall 22 is immersed in the thermosetting resin 4A while a gas layer 25 is held in the inside space 24. The gas layer 25 is made of gas (usually air) in atmosphere where the mold member 20 is placed.

Since the gas layer 25 is held inside the first partition wall 22, a partial region 4A1 of the upper face (surface) of the thermosetting resin 4A is depressed by the first partition wall 22 and the gas layer 25 therein, and this region 4A1 is positioned lower in level than other regions.

The mold member 20 is positioned so that the depressed region 4A1 encompasses the electronic components 2 in plan view.

It is desirable that the mold member 20 is positioned so that the first main surface 21a of the main plate portion 21 does not contact the thermosetting resin 4A in a region outside the first partition wall 22, as shown in FIG. 3(d).

Thus, even in the region outside the first partition wall 22, it is possible to avoid formation of recessed defects caused by bubbles.

The height position of the mold member 20 can be determined by, for example, placing the main plate portion 21 onto a locking protruding portion (not shown) formed on the inner surface of the side plate 6b of the module case 6.

As described above, the molded protruding portion 5b protruding upward is formed in the region 4A1 in some cases.

The molded protruding portion 5b is formed by the surface tension of the thermosetting resin 4A, on the lower end portion of the inner surface of the first partition wall 22. For this reason, an inner surface 5b1 of the molded protruding portion 5b has a curved shape such that the inclination angle (inclination angle to a horizontal plane) increases as the height of the protrusion becomes increased. An outer surface 5b2 of the molded protruding portion 5b is formed by the inner surface of the first partition wall 22, and thereby becomes perpendicular to the mounting surface 1a. The molded protruding portion 5b is formed along the cylindrical first partition wall 22, and therefore becomes annular in plan view (see FIG. 2).

(Curing Step)

Then, the thermosetting resin 4A in the module case 6 is heated and thereby is cured. Thereby, the sealing resin 4 embedded with the substrate with the electronic components 7 is formed. The region 4A1, which is depressed by the first partition wall 22 and the gas layer 25, becomes the low-level region 5a of the recessed portion 5 (see FIG. 1).

A region of the low-level region 5a (region inside the vertex of the molded protruding portion 5b), which has been depressed by the gas layer 25, does not contact the mold member 20. For this reason, that depressed region of the low-level region 5a has a small surface roughness, compared to a portion which has been shaped in contact with the mold member 20. Here, as an index of surface roughness, there is an arithmetic mean roughness Ra (JIS B0601-2001).

Since the region shaped by the gas layer 25 has a small surface roughness, the reflectance of light is higher in that region than in other regions. A planar shape of that region becomes a shape unique to the resin sealing module 10. For this reason, it is possible to distinguish the resin sealing module 10 from other resin sealing modules, based on a pattern of reflected light when the resin sealing module 10 is irradiated with light.

(Removal Step)

Then, the mold member 20 is removed from the sealing resin 4.

Through the above steps, the resin sealing module 10 shown in FIG. 1 is obtained.

In the method of manufacturing the resin sealing module of the present embodiment, the mold member 20 has the first partition wall 22 which surrounds the first predetermined region 21a1 of the main plate portion 21.

For this reason, the gas layer 25 is held in the inside space 24 of the first partition wall 22, and the region 4A1 of the thermosetting resin 4A is depressed by the first partition wall 22 and the gas layer 25, thus enabling shaping of the surface of the thermosetting resin 4A.

The region 4A1 depressed by the gas layer 25 does not contact the mold member 20, thereby making it possible to enlarge a region of the surface of the thermosetting resin 4A, which does not contact the mold member 20. Further, no bubble remains in the region that does not contact the mold member 20, thereby making it possible to suppress recessed defects caused by bubbles from being formed on the surface of the sealing resin 4.

Additionally, the recessed portion 5 is formed in the sealing resin 4, thereby making it possible to reduce the amount of thermosetting resin 4A by the volume of the recessed portion 5 and to reduce the weight of the resin sealing module 10.

[Modified Example of First Embodiment] (Method of Manufacturing Resin Sealing Module)

In the manufacturing method of the present invention, the thermosetting resin 4A may be injected into the module case 6 before the printed substrate 1 is housed in the module case 6. A method of manufacturing a resin sealing module in this case is as follows.

Hereinafter, the same configuration as that of the first embodiment will be appended with the same reference numeral, and description thereof will be omitted.

(Mounting Step)

Similarly to the first embodiment, the electronic components 2 and 3 are mounted on the mounting surface 1a of the printed substrate 1, thus obtaining the substrate with electronic components 7.

(Injection Step)

The liquid thermosetting resin 4A is injected into the module case 6.

(Housing Step)

The substrate with electronic components 7 is immersed into the thermosetting resin 4A in the module case 6.

A positioning step, a curing step, and a removal step are the same as those of the manufacturing method of the first embodiment.

[Second Embodiment] (Resin Sealing Module)

Next, a resin sealing module 30 according to a second embodiment will be described with reference to FIG. 5.

Figure 5:
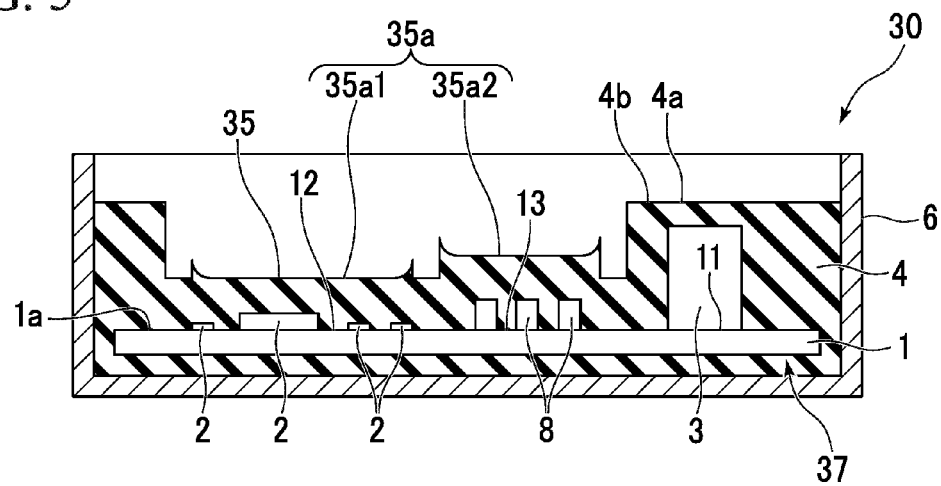
FIG. 5 is a cross-sectional view showing a resin sealing module according to a second embodiment of the present invention.

As shown in FIG. 5, in the resin sealing module 30, a recessed portion 35 is formed on the surface 4a of the sealing resin 4. A bottom surface 35a of the recessed portion 35 has a first low-level region 35a1 and a second low-level region 35a2 positioned higher in level than the first low-level region 35a1.

Both the first low-level region 35a1 and the second low-level region 35a2 are positioned lower in level than a region outside the recessed portion 35 (reference region 4b).

In the first low-level region 35a1, the electronic components 2 formed on the second region 12 are embedded in the sealing resin 4.

In the second low-level region 35a2, electronic components 8 formed on a third region 13 are embedded in the sealing resin 4. The third region 13 is a region of the mounting surface 1a, which is different from the first region 11 and the second region 12.

The height dimension, from the mounting surface 1a, of the electronic component 8 is smaller than that of the electronic component 3, and is larger than that of the electronic component 2.

[Second Embodiment] (Method of Manufacturing Resin Sealing Module)

Next, a method of manufacturing the resin sealing module 30 according to the second embodiment will be described with reference to FIG. 6.

(Mounting Step)

Figure 6:
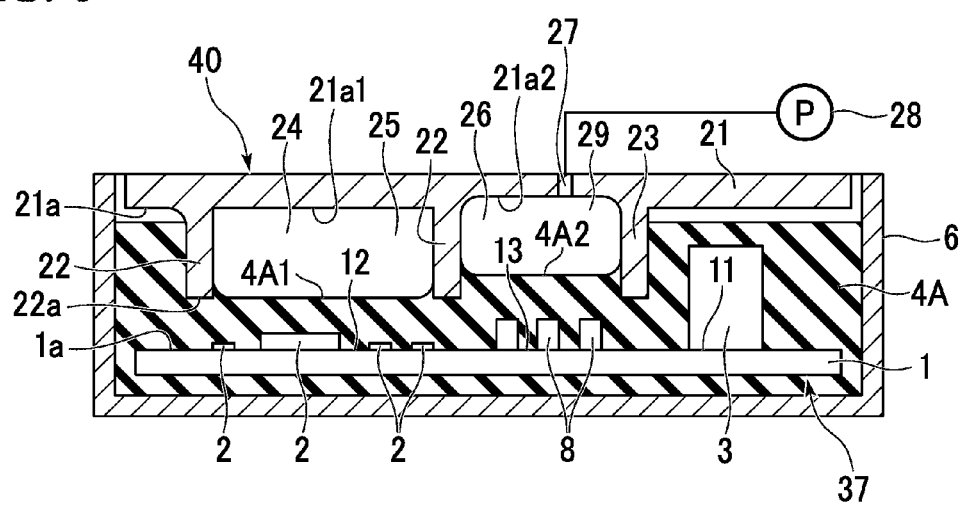
FIG. 6 is a view illustrating a method of manufacturing the resin sealing module according to the second embodiment of the present invention.

As shown in FIG. 6, the electronic components 2, 3, and 8 are mounted on the mounting surface 1a of the printed substrate 1, thus obtaining a substrate with electronic components 37.

(Housing Step)

The substrate with electronic components 37 is housed in the module case 6.

(Injection Step)

The thermosetting resin 4A is injected into the module case 6, and the substrate with electronic components 37 is immersed into the thermosetting resin 4A.

(Positioning Step)

A mold member 40 is prepared. The mold member 40 includes the main plate portion 21, and the first partition wall 22 and a second partition wall 23 which protrude from the first main surface 21a of the main plate portion 21.

The second partition wall 23 is formed so as to surround a second predetermined region 21a2 of the first main surface 21a, which is different from the first predetermined region 21a1.

In the example shown in FIG. 6, the second predetermined region 21a2 is a region outside the first predetermined region 21a1.

The second partition wall 23 may be provided so as to be connected to the outer surface of the first partition wall 22. In this structure, a portion of the first partition wall 22 and the second partition wall 23 surround the second predetermined region 21a2.

The height, from the first main surface 21a, of the protrusion of the second partition wall 23 may be the same as, or different from, that of the first partition wall 22.

A top surface inside the second partition wall 23 (second predetermined region 21a2) may have the same level as, or different level from, the top surface inside the first partition wall 22 (first predetermined region 21a1).

In the example shown in FIG. 6, the top surface inside the second partition wall 23 is positioned higher in level than the top surface inside the first partition wall 22, thereby achieving a high degree of freedom in selecting the liquid level of the resin inside the second partition wall 23.

A vent hole 27 penetrating the main plate portion 21 is formed in the main plate portion 21, inside the second partition wall 23.

The vent hole 27 is connected to an external air pump 28 (gas supply-discharge means). Through the vent hole 27, gas (e.g., air) can be supplied to or discharged from an inside space 26 of the second partition wall 23.

The mold member 40 is positioned so that at least the protruding end portion 22a of the first partition wall 22 is immersed in the thermosetting resin 4A. The position of the mold member 40 is determined so that the inside space 24 of the first partition wall 22 faces the second region 12, and the inside space 26 of the second partition wall 23 faces the third region 13.

The partial region 4A1 of the upper face (surface) of the thermosetting resin 4A is depressed by the first partition wall 22 and the gas layer 25. The partial region 4A2 different from the partial region 4A1 is depressed by the second partition wall 23 and the gas layer 29 inside the second partition wall 23.

The region 4A1 depressed by the first partition wall 22 and the gas layer 25 becomes the first low-level region 35a1, and the region 4A2 depressed by the second partition wall 23 and the gas layer 29 becomes a second low-level region 35a2 (see FIG. 5).

When the upper face (surface) of the thermosetting resin 4A is depressed by the second partition wall 23 and the gas layer 29, gas (e.g., air) is supplied to, or discharged from, the inside space 26 of the second partition wall 23 through the vent hole 27, thus making it possible to adjust the liquid level of the thermosetting resin 4A (region 4A2) inside the second partition wall 23.

In FIG. 6, the liquid level of the region 4A2 inside the second partition wall 23 is set higher than the liquid level of the region 4A1 inside the first partition wall 22. Here, the liquid levels of the regions 4A1 and 4A2 may be optionally set by adjusting the height of the protrusions of the partition walls 22 and 23.

A positioning step, a curing step, and a removal step are the same as those of the manufacturing method of the first embodiment.

Through the above steps, the resin sealing module 30 shown in FIG. 5 is obtained.

As to the mold member 40 shown in the example of FIG. 6, the second predetermined region 21a2 surrounded by the second partition wall 23 is a region outside the first partition wall 22. However, the second predetermined region surrounded by the second partition wall may be a region inside the first partition wall. For example, the second partition wall may be a cylindrical structure formed inside, but separate from, the first partition wall. Additionally, the second partition wall may be a cylindrical structure formed outside, and independent of, the first partition wall.

[Third Embodiment] (Resin Sealing Module)

Next, a resin sealing module 60 according to the third embodiment will be described with reference to FIG. 7.

Figure 7:
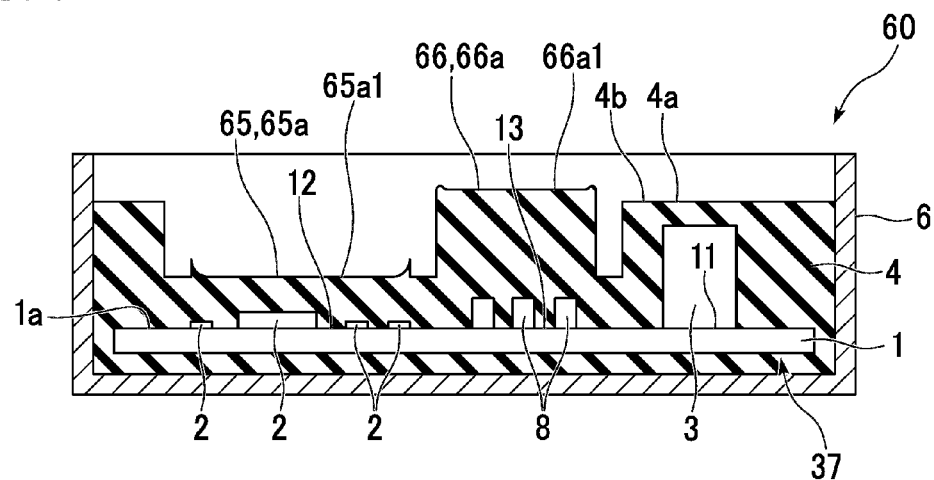
FIG. 7 is a cross-sectional view showing a resin sealing module according to a third embodiment of the present invention.

As shown in FIG. 7, the resin sealing module 60 differs from the resin sealing module 30 shown in FIG. 5 in that a recessed portion 65 and a protruding portion 66 are formed on the surface 4a of the sealing resin 4.

A bottom surface 65a of the recessed portion 65 is a low-level region 65a1 that is lower in level than the reference region 4b.

An upper surface 66a of the protruding portion 66 is a high-level region 66a1 that is higher in level than the low-level region 65a1 and the reference region 4b.

[Third Embodiment] (Method of Manufacturing Resin Sealing Module)

Next, a method of manufacturing the resin sealing module 60 according to the third embodiment will be described with reference to FIG. 8.

A mounting step, a housing step, and an injection step are the same as those of the manufacturing method of the second embodiment.

(Positioning Step)

Figure 8:
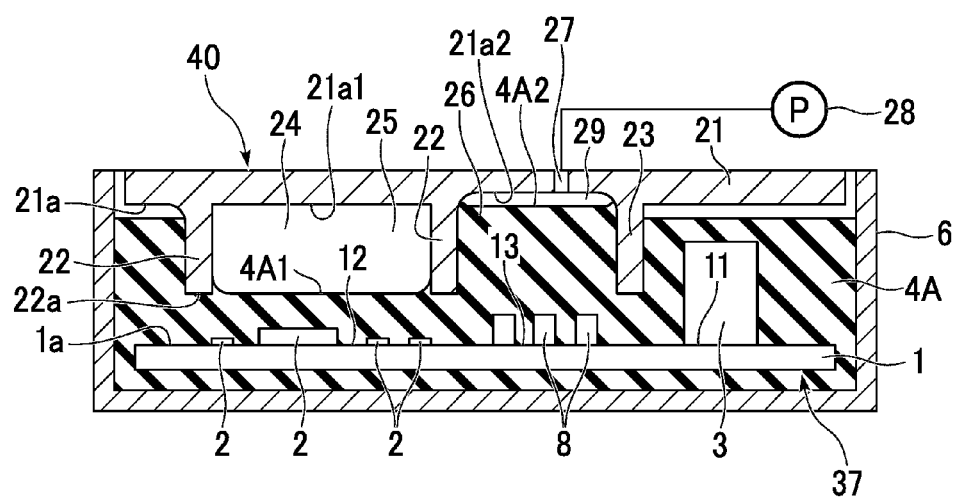
FIG. 8 is a view illustrating a method of manufacturing the resin sealing module according to the third embodiment of the present invention.

As shown in FIG. 8, a mold member 40 similar to that used in the second embodiment is prepared. A top surface of the mold member 40 inside the second partition wall 23 is formed higher in level than the top surface thereof inside the first partition wall 22.

When a part of the first partition wall 22 of the mold member 40 is immersed in the thermosetting resin 4A, the region 4A1 is depressed by the first partition wall 22 and the gas layer 25.

In the present embodiment, gas (e.g., air) is discharged from the inside space 26 of the second partition wall 23 through the vent hole 27, thus making the liquid level of the resin on the region 4A2 inside the second partition wall 23 higher than a liquid level of the resin on a region outside the partition walls 22 and 23.

A positioning step, a curing step, and a removal step are the same as those of the manufacturing method of the first embodiment.

By these steps, the region 4A1 inside the first partition wall 22 becomes the low-level region 65a1 that is lower in level than the reference region 4b, and the region 4A2 inside the second partition wall 23 becomes higher in level than the high-level region 66a1 that is higher in level than the reference region 4b.

Through the above steps, the resin sealing module 60 shown in FIG. 7 is obtained.

[Fourth Embodiment] (Resin Sealing Module)

Next, a resin sealing module 50 according to a fourth embodiment will be described with reference to FIG. 9.

Figure 9:
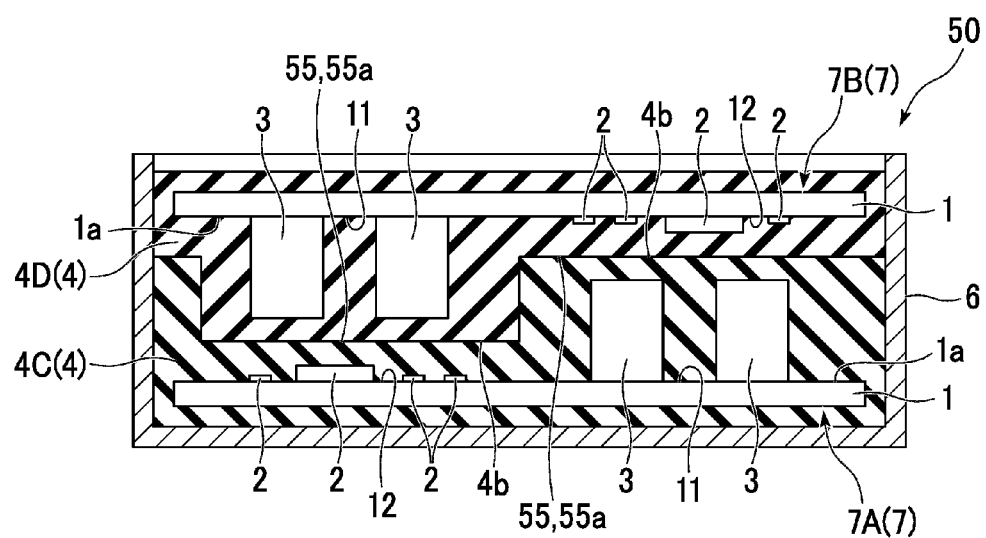
FIG. 9 is a cross-sectional view showing a resin sealing module according to a fourth embodiment of the present invention.

As shown in FIG. 9, the resin sealing module 50 includes two substrates with electronic components 7 (7A, 7B), which are covered respectively by sealing resins 4 (4C, 4D).

More specifically, the resin sealing module 50 includes first and second substrates with electronic components 7A and 7B, the module case 6 housing the first and second substrates with electronic components 7A and 7B, a first sealing resin 4C embedded with the first substrate with electronic components 7A, and a second sealing resin 4D embedded with the second substrate with electronic components 7B.

The two substrates with electronic components 7A and 7B are arranged so that the mounting surface 1a of each substrate face each other. In each of the sealing resins 4C and 4D, a recessed portion 55 is formed in a region overlapping the second region 12 in which the electronic components 2 with little height are mounted.

A low-level region 55a of the recessed portion 55 of the first sealing resin 4C contacts the reference region 4b of the second sealing resin 4D. A low-level region 55a of the recessed portion 55 of the second sealing resin 4D contacts the reference region 4b of the first sealing resin 4C.

It is desirable that the sealing resins 4C and 4D are formed with no gap therebetween and are integrated with each other.

[Fourth Embodiment] (Method of Manufacturing Resin Sealing Module)

The resin sealing module 50 can be manufactured in the following manner.

A resin sealing module is formed using the substrate with electronic components 7A in the same manner as in the first embodiment. Thereafter, the substrate with electronic components 7B is placed on the sealing resin 4C of the formed resin sealing module. In this case, it is preferable that the substrate with electronic components 7B is placed separately from the sealing resin 4C.

The thermosetting resin 4A is supplied to the upper and lower surface sides of the substrate with electronic components 7B, and then is cured to form the sealing resin 4D.

In the resin sealing module 50, the sealing resins 4C and 4D are placed so that a region with large thickness dimension (reference region 4b) of one sealing resin faces a region with small thickness dimension (low-level region 55a) of the other sealing resin. For this reason, the two substrates with electronic components 7 (7A, 7B) can be placed in the module case 6 without greatly increasing the thickness dimension. Therefore, it is possible to achieve both multi-functionality and miniaturization.

[Fifth Embodiment] (Method of Manufacturing Resin Sealing Module)

Next, a method of manufacturing a resin sealing module according to a fifth embodiment will be described with reference to FIG. 10.

Figure 10:
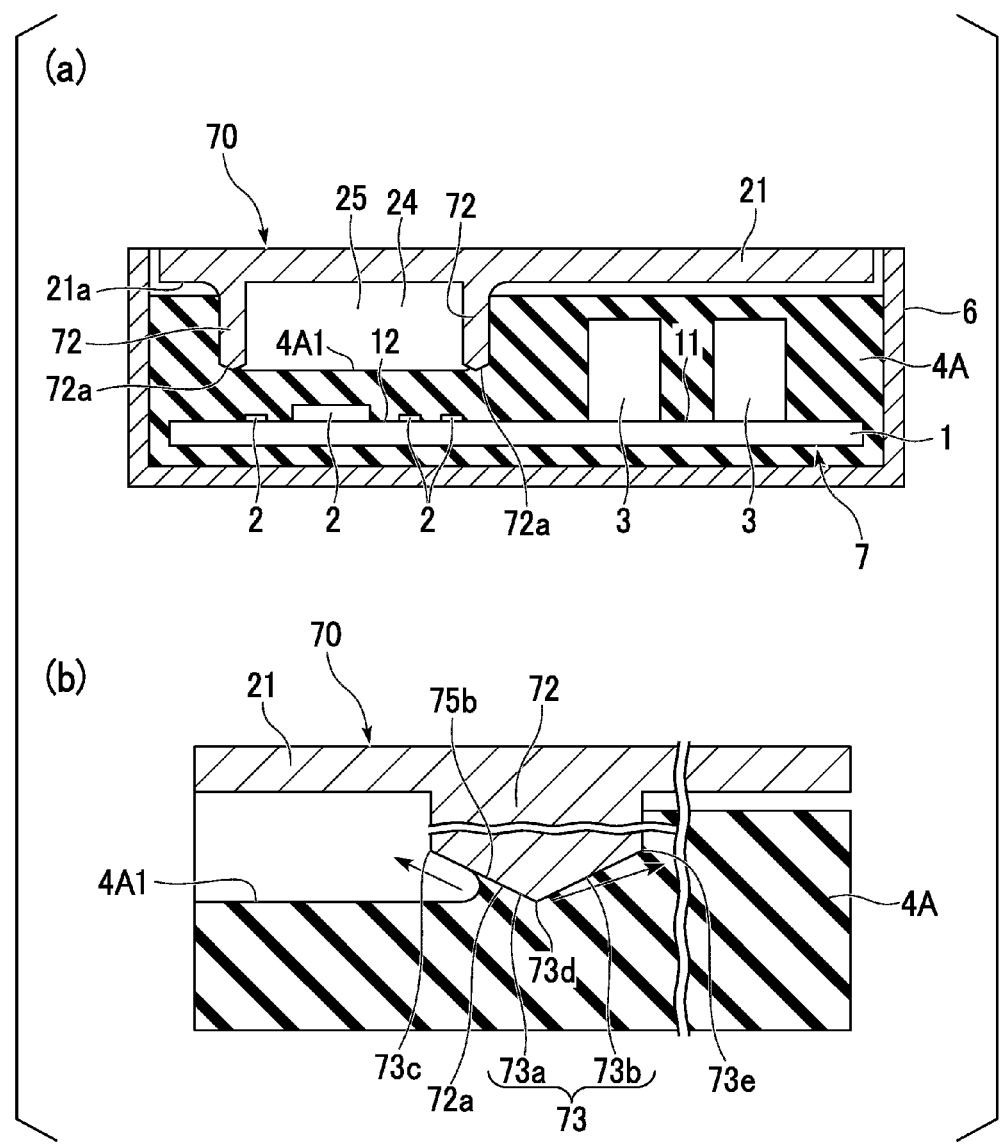
FIG. 10 is a view showing a resin sealing module and a method of manufacturing the resin sealing module according to a fifth embodiment of the present invention, (a) is an overall view, and (b) is an enlarged view.

As shown in FIG. 10, a mold member 70 to be used in this manufacturing method differs from the mold member 20 used in the manufacturing method of the first embodiment in that an end face 73 of a protruding end portion 72a of a first partition wall 72 is inclined to the first main surface 21a.

As shown in FIG. 10(b), the end face 73 has an inner inclined surface 73a that is inclined so as to increase in protrusion height from an inner edge 73c toward a tip 73d, and an outer inclined surface 73b that is inclined so as to reduce in protrusion height from the tip 73d toward an outer edge 73e.

The manufacturing method of the present embodiment may be similar to the method for manufacturing the resin sealing module 10 of the first embodiment, except that the mold member 70 is used in place of the mold member 20.

Figure 11:
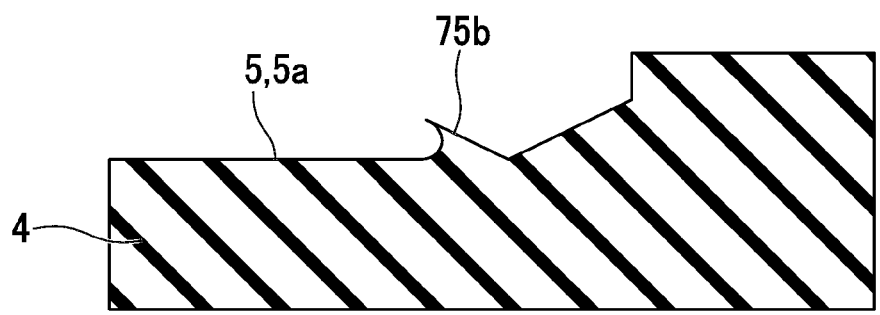
FIG. 11 is a cross-sectional view showing a part of the resin sealing module according to the fifth embodiment of the present invention.

As shown in FIGS. 10(b) and 11, a molded protruding portion 75b is occasionally formed by surface tension of the thermosetting resin 4A, on a region contacting the inner inclined surface 73a.

As to the mold member 70, since the end face 73 has inclined surfaces, even if bubbles are included in the thermosetting resin 4A in the positioning step, the bubbles float along the inclination of the inner inclined surface 73a and the inclination of the outer inclined surface 73b. For this reason, it is possible to prevent the bubbles from remaining on the end face 73. Therefore, it is possible to suppress recessed defects from being formed on a surface of the sealing resin 4.

[Modified Example of Fifth Embodiment] (Method of Manufacturing Resin Sealing Module)

Next, a modified example of the method of manufacturing a resin sealing module according to the fifth embodiment will be described with reference to FIG. 12.

Figure 12:
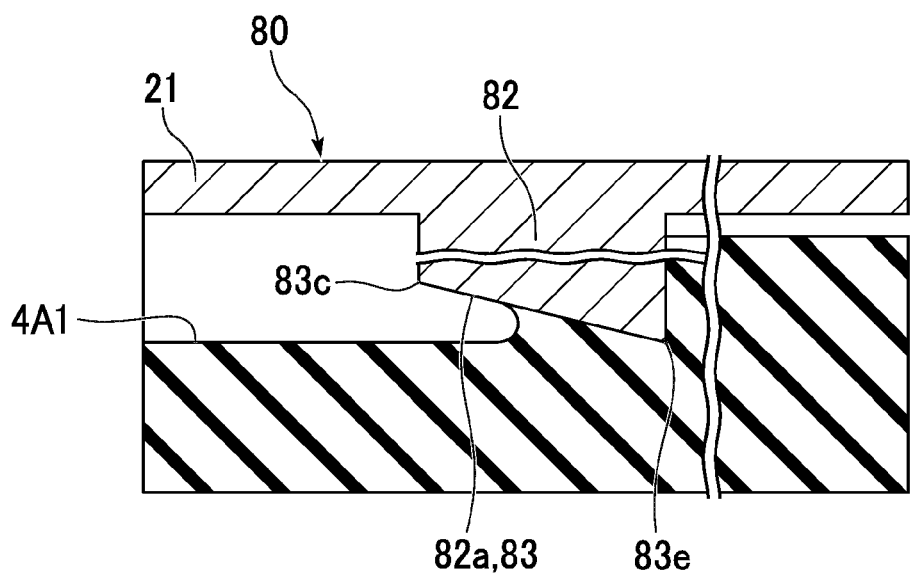
FIG. 12 is a view illustrating a modified example of the method of manufacturing the resin sealing module according to the fifth embodiment of the present invention.

As shown in FIG. 12, a mold member 80 to be used in this manufacturing method differs from the mold member 70 shown in FIG. 10 in that an end face 83 of a protruding end portion 82a of a first partition wall 82 is an inclined surface inclined in the same direction over the entire surface.

The end face 83 is an inclined surface inclined so as to increase in protrusion height from an inner edge 83c toward an outer edge 83e.

Even in a case where the mold member 80 is used, bubbles float along the inclination of the end face 83 in the positioning step, thereby preventing the bubbles from remaining on a surface of the mold member 80. Therefore, it is possible to suppress recessed defects from being formed on a surface of the sealing resin 4.

The resin sealing module of the present invention can be used in electric devices, such as a regulator (REG), a capacitor discharge igniter (CDI), an engine control unit (ECU), or a controller of a headlight (LED).

Without departing from the spirit of the present invention, the configurations described in the above embodiments may be sifted through, or appropriately changed to other configurations.

For example, in the resin sealing module 10 of the first embodiment shown in FIG. 1, the electronic components 3 are mounted on the first region 11, and the electronic components 2 are mounted on the second region 12. However, the mounting positions of the electronic components 2, 3 on the mounting surface 1a are not limited to the illustrated examples. For example, a structure may be such that no electronic component is mounted on one of the regions 11 and 12.

DESCRIPTION OF REFERENCE NUMERALS

1: printed substrate
1a: mounting surface
4: sealing resin (resin)
4A: thermosetting resin (uncured curable liquid resin)
4A1: region (depressed region)
5: recessed portion
6: module case
7, 37: substrate with electronic components
10: resin sealing module
11: first region
12: second region
13: third region
20, 40, 70, 80: mold member
21: main plate portion
21a: first main surface
21a1: first predetermined region
21a2: second predetermined region
22, 72: first partition wall
22a, 72a, 82a: protruding end portion
23: second partition wall
24, 26: inside space
25, 29: gas layer
27: vent hole
73, 83: end face
73a: inside inclined surface
73b: outside inclined surface
83a: inclined surface

The invention claimed is:

1. A method of manufacturing a resin sealing module in which a substrate with electronic components including a substrate and electronic components mounted on a mounting surface of the substrate is sealed by a resin, the method of manufacturing the resin sealing module comprising:
mounting electronic components on a first region that is a part of the mounting surface to obtain the substrate with electronic components;
housing the substrate with electronic components in a module case;
injecting an uncured curable liquid resin into the module case to fill up the module case with the uncured curable liquid resin covering the substrate with electronic components;
positioning a mold member including a main plate portion and a first partition wall protruding from a first main surface of the main plate portion and surrounding a first predetermined region of the first main surface, so that inside space of the first partition wall faces a second region of the mounting surface, the second region being different from the first region;
curing the curable liquid resin in the module case; and
removing the mold member from the cured resin,
wherein positioning the mold member is performed so that at least a protruding end portion of the first partition wall is immersed into the curable liquid resin while a gas layer is held in the inside space, and thereby a partial region of an upper surface of the curable liquid resin is depressed by the gas layer, so that the partial region is positioned lower in level than other regions.

2. The method of manufacturing the resin sealing module according to claim 1, wherein the mold member includes a second partition wall protruding from the first main surface, the second partition wall is formed so as to surround a second predetermined region of the main surface, the second predetermined region being different from the first predetermined region, a vent hole penetrating the main plate portion is formed in the main plate portion, inside the second partition wall, and positioning the mold member is performed so that inside space of the second partition wall faces a third region of the mounting surface, the third region being different from the first region and the second region.

3. The method of manufacturing the resin sealing module according to claim 2, wherein positioning the mold member is performed so that gas is supplied to, or discharged from, the inside space of the second partition wall through the vent hole, and thereby a liquid level of the curable liquid resin inside the second partition wall is adjusted.

4. The method of manufacturing the resin sealing module according to claim 1, wherein an end face of the protruding end portion of the first partition wall has an inclined surface inclined to the first main surface of the main plate portion.

* * * * *